United States Patent
Sung et al.

(10) Patent No.: US 10,170,456 B2
(45) Date of Patent: Jan. 1, 2019

(54) SEMICONDUCTOR PACKAGES INCLUDING HEAT TRANSFERRING BLOCKS AND METHODS OF MANUFACTURING THE SAME

(71) Applicant: SK hynix Inc., Icheon-si, Gyeonggi-do (KR)

(72) Inventors: Ki Jun Sung, Cheongju-si (KR); Rae Hyung Jeong, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/635,600

(22) Filed: Jun. 28, 2017

(65) Prior Publication Data

US 2018/0175011 A1 Jun. 21, 2018

(30) Foreign Application Priority Data

Dec. 19, 2016 (KR) .................. 10 2016 0173987

(51) Int. Cl.
*H01L 25/18* (2006.01)
*H01L 23/373* (2006.01)
(Continued)

(52) U.S. Cl.
CPC ........ *H01L 25/18* (2013.01); *H01L 21/32115* (2013.01); *H01L 21/565* (2013.01);
(Continued)

(58) Field of Classification Search
CPC ..... H01L 25/18; H01L 25/0655; H01L 25/50; H01L 21/32115; H01L 21/565; H01L 23/3121; H01L 23/3675; H01L 23/3736; H01L 23/5381; H01L 23/5383; H01L 23/5384; H01L 23/5386; H01L 23/562; H01L 23/3128; H01L 24/16; H01L 2224/16227; H01L 2924/1432; H01L 2924/1434; H01L 2924/351; H01L 2924/3511; H01L 2924/15192; H01L 2924/1531; H01L 2924/15311;
(Continued)

(56) References Cited

U.S. PATENT DOCUMENTS 9,165,793 B1 10/2015 Wang et al.
2013/0093074 A1* 4/2013 Grant .................. H01L 25/0655
257/693

(Continued)

OTHER PUBLICATIONS

Komori, Shinji et al., Development Trend of Epoxy Molding Compound for Encapsulating Semiconductor Chips, Materials for Advanced Packaging, 2009, pp. 339-363, Springer Science+ Business Media, LLC.

*Primary Examiner* — Cheung Lee
*Assistant Examiner* — Stephen C Smith
(74) *Attorney, Agent, or Firm* — William Park & Associates Ltd.

(57) ABSTRACT

A semiconductor package may be provided. The semiconductor package may include a first semiconductor chip and a second semiconductor chip disposed on an interconnection layer. The semiconductor package may include a heat transferring block disposed between the first and second semiconductor chips to be mounted on the interconnection layer. Related methods are also provided.

20 Claims, 10 Drawing Sheets

(51) Int. Cl.
*H01L 23/367* (2006.01)
*H01L 21/321* (2006.01)
*H01L 25/00* (2006.01)
*H01L 21/56* (2006.01)
*H01L 23/538* (2006.01)
*H01L 23/00* (2006.01)
*H01L 23/31* (2006.01)
*H01L 25/065* (2006.01)

(52) U.S. Cl.
CPC ...... *H01L 23/3121* (2013.01); *H01L 23/3675* (2013.01); *H01L 23/3677* (2013.01); *H01L 23/3737* (2013.01); *H01L 23/5381* (2013.01); *H01L 23/5383* (2013.01); *H01L 23/5384* (2013.01); *H01L 23/5386* (2013.01); *H01L 23/562* (2013.01); *H01L 24/16* (2013.01); *H01L 25/0655* (2013.01); *H01L 25/50* (2013.01); *H01L 23/3128* (2013.01); *H01L 23/3736* (2013.01); *H01L 2224/16227* (2013.01); *H01L 2224/73253* (2013.01); *H01L 2224/81005* (2013.01); *H01L 2224/97* (2013.01); *H01L 2924/1432* (2013.01); *H01L 2924/1434* (2013.01); *H01L 2924/1531* (2013.01); *H01L 2924/15192* (2013.01); *H01L 2924/15311* (2013.01); *H01L 2924/18161* (2013.01); *H01L 2924/351* (2013.01); *H01L 2924/3511* (2013.01)

(58) Field of Classification Search
CPC ........... H01L 2924/18161; H01L 2224/73253; H01L 2224/81005
See application file for complete search history.

(56) References Cited

U.S. PATENT DOCUMENTS

| | | |
|---|---|---|
| 2014/0077394 A1 | 3/2014 | Chang et al. |
| 2014/0159247 A1* | 6/2014 | Lyne ............. H01L 25/065 257/774 |
| 2015/0001701 A1* | 1/2015 | Li ................. H01L 23/02 257/713 |

* cited by examiner

SEMICONDUCTOR PACKAGES INCLUDING HEAT TRANSFERRING BLOCKS AND METHODS OF MANUFACTURING THE SAME

CROSS-REFERENCE TO RELATED APPLICATIONS

The present application claims priority under 35 U.S.C 119(a) to Korean Application No. 10-2016-0173987, filed on Dec. 19, 2016, which is incorporated herein by reference in its entirety.

BACKGROUND

1. Technical Field

Embodiments of the present disclosure may generally relate to semiconductor packages and, more particularly, to semiconductor packages relating to heat transferring blocks and methods of manufacturing the same.

2. Related Art

In the electronics industry, a single unified package including a plurality of semiconductor devices is increasingly in demand with the development of multi-functional and larger storage capacities of smaller sized electronic systems or products. The single unified package may be designed to reduce a total size thereof and to have various functions. The single unified package may be realized to include a plurality of semiconductor chips having different functions. This is for processing a large amount of data at a time.

A system-in-package (SIP) has been proposed to provide the single unified package. For example, a lot of effort has been focused on integrating at least one application processor chip and at least one memory chip in a single SIP. If the application processor chip (e.g., a microprocessor chip) and the memory chip are included in a single SIP, a lot of heat may be generated in the single SIP while the single SIP operates. Thus, various techniques have been proposed to efficiently emit the heat from the single SIP.

SUMMARY

According to an embodiment, a semiconductor package may be provided. The semiconductor package may include a first semiconductor chip and a second semiconductor chip disposed on an interconnection layer. The semiconductor package may include a heat transferring block disposed between the first and second semiconductor chips to be mounted on the interconnection layer.

According to an embodiment, a semiconductor package may be provided. The semiconductor package may include a first semiconductor chip and a second semiconductor chip disposed on an interconnection layer and laterally spaced apart from each other, a heat transferring block disposed between the first and second semiconductor chips to be mounted on the interconnection layer, an encapsulant filling spaces between the heat transferring block and the first and second semiconductor chips and covering sidewalls of the first and second semiconductor chips, and a heat dissipation layer connected to a top surface of the heat transferring block opposite to the interconnection layer and extending to cover a top surface of the encapsulant. The heat transferring block may be configured to reduce a thermal stress applied to the semiconductor package.

According to an embodiment, a semiconductor package may include a first semiconductor chip and a second semiconductor chip disposed on an interconnection layer and laterally spaced apart from each other to accommodate a heat sink pattern, a heat transferring block disposed between the first and second semiconductor chips to be mounted on the interconnection layer and to be coupled to the heat sink pattern, an encapsulant filling spaces between the heat transferring block and the first and second semiconductor chips and covering sidewalls of the first and second semiconductor chips, and a heat dissipation layer connected to a top surface of the heat transferring block opposite to the interconnection layer and extending to cover a top surface of the encapsulant.

According to an embodiment, a semiconductor package may include a first semiconductor chip and a second semiconductor chip disposed on an interconnection layer and spaced apart from each other, a heat transferring block disposed between the first and second semiconductor chips and bonded to the interconnection layer by an adhesive layer, an encapsulant filling spaces between the heat transferring block and the first and second semiconductor chips and covering sidewalls of the first and second semiconductor chips, and a heat dissipation layer connected to a top surface of the heat transferring block opposite to the interconnection layer and extending to cover a top surface of the encapsulant. The adhesive layer bonds the interconnection layer to a bottom surface of the heat transferring block.

According to an embodiment, there may be provided a method of manufacturing a semiconductor package. The method may include forming an interconnection layer on a carrier, disposing a first semiconductor chip and a second semiconductor chip on the interconnection layer to be spaced apart from each other, disposing a heat transferring block on the interconnection layer between the first and second semiconductor chips, forming an encapsulant that fills spaces between the heat transferring block and the first and second semiconductor chips and covers sidewalls of the first and second semiconductor chips, and forming a heat dissipation layer that is connected to a top surface of the heat transferring block opposite to the interconnection layer. The heat dissipation layer extends to cover a top surface of the encapsulant. The heat transferring block may be configured to reduce a thermal stress applied to the semiconductor package.

According to an embodiment, there may be provided a method of manufacturing a semiconductor package. The method may include forming an interconnection layer having a heat sink pattern on a carrier, disposing a first semiconductor chip and a second semiconductor chip on the interconnection layer to be spaced apart from each other, disposing a heat transferring block on the interconnection layer between the first and second semiconductor chips, forming an encapsulant that fills spaces between the heat transferring block and the first and second semiconductor chips and covers at least sidewalls of the first and second semiconductor chips, and forming a heat dissipation layer that is connected to a top surface of the heat transferring block opposite to the interconnection layer and extends to cover a top surface of the encapsulant.

According to an embodiment, there may be provided a method of manufacturing a semiconductor package. The method may include forming an interconnection layer on a carrier, disposing a first semiconductor chip and a second semiconductor chip on the interconnection layer to be spaced apart from each other, disposing a heat transferring block on the interconnection layer between the first and second semiconductor chips, forming an encapsulant that fills spaces between the heat transferring block and the first and second semiconductor chips and covers at least sidewalls of the first and second semiconductor chips, and forming a heat dissipation layer that is connected to a top surface of the heat transferring block opposite to the interconnection layer and extends to cover a top surface of the encapsulant. The interconnection layer is bonded to a bottom surface of the heat transferring block by an adhesive layer.

DETAILED DESCRIPTION

Figure 1:
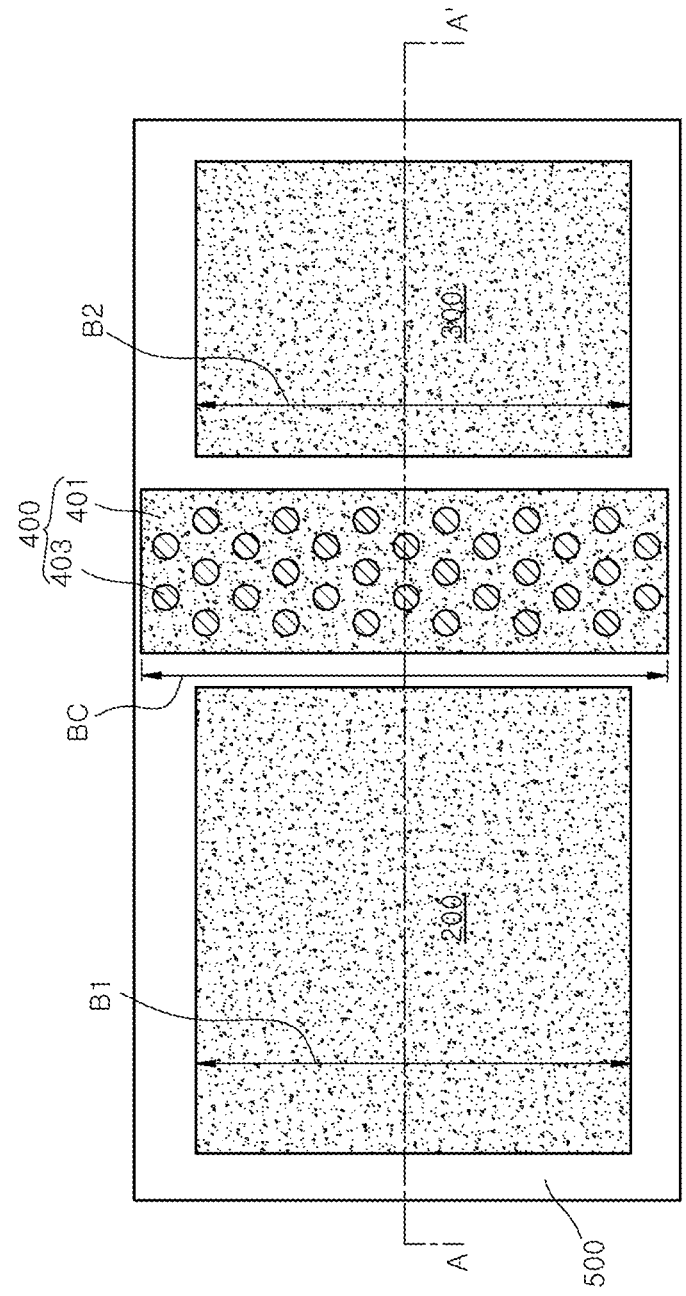
FIGS. 1 and 2 are a plan view and a cross-sectional view illustrating a semiconductor package according to an embodiment, respectively.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong. It will be understood that although the terms first, second, third etc. may be used herein to describe various elements, these elements should not be limited by these terms. These terms are only used to distinguish one element from another element, but not used to define only the element itself or to mean a particular sequence.

Semiconductor packages according to the following embodiments may correspond to, for example but not limited to, system-in-packages (SIPs). Each of the semiconductor packages may be realized to include a plurality of semiconductor chips (i.e., semiconductor devices), at least two of which are designed to have different functions. The semiconductor chips may be obtained by separating a semiconductor substrate such as a wafer including electronic circuits into a plurality of pieces (having semiconductor die shapes or semiconductor chip shapes) using a die sawing process. Alternatively, each of the semiconductor chips may have a package form including a package substrate and a semiconductor die mounted on the package substrate. Each of the semiconductor chips may include a plurality of semiconductor dies which are vertically stacked to have a three-dimensional structure, and the plurality of semiconductor dies may be electrically connected to each other by silicon through vias (TSVs) penetrating the plurality of semiconductor dies. The semiconductor dies may correspond to memory dies including, for example but not limited to, dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The semiconductor chips or the semiconductor packages may be employed in communication systems such as mobile phones, electronic systems associated with biotechnology or health care, or wearable electronic systems, etc.

In some embodiments, the semiconductor chip may corresponds to a logic chip having a system-on-chip (SoC) form. The SoC may be an application specific integrated circuit (ASIC) chip including a microprocessor, a microcontroller, an application processor, a digital signal processing core or an interface. The SoC may include a central processing unit (CPU) or a graphics processing unit (GPU).

In order that the SoC operates at a high speed, the SoC has to communicate with a memory chip storing data at a high speed. That is, a short interface path and a high signal bandwidth may be required to improve an operation speed of the SoC. For example, if a mobile application processor chip and a high bandwidth memory (HBM) chip are disposed side-by-side in a single SIP, an interface path between the mobile application processor chip and the HBM chip including memory dies may be reduced to improve an operation speed of the SIP. The memory dies included in the HBM chip may be vertically stacked and may be electrically connected to each other by through silicon vias (TSVs).

The same reference numerals refer to the same elements throughout the specification. Thus, even though a reference numeral is not mentioned or described with reference to a drawing, the reference numeral may be mentioned or described with reference to another drawing. In addition, even though a reference numeral is not illustrated in a drawing, it may be mentioned or described with reference to another drawing.

Figure 2:
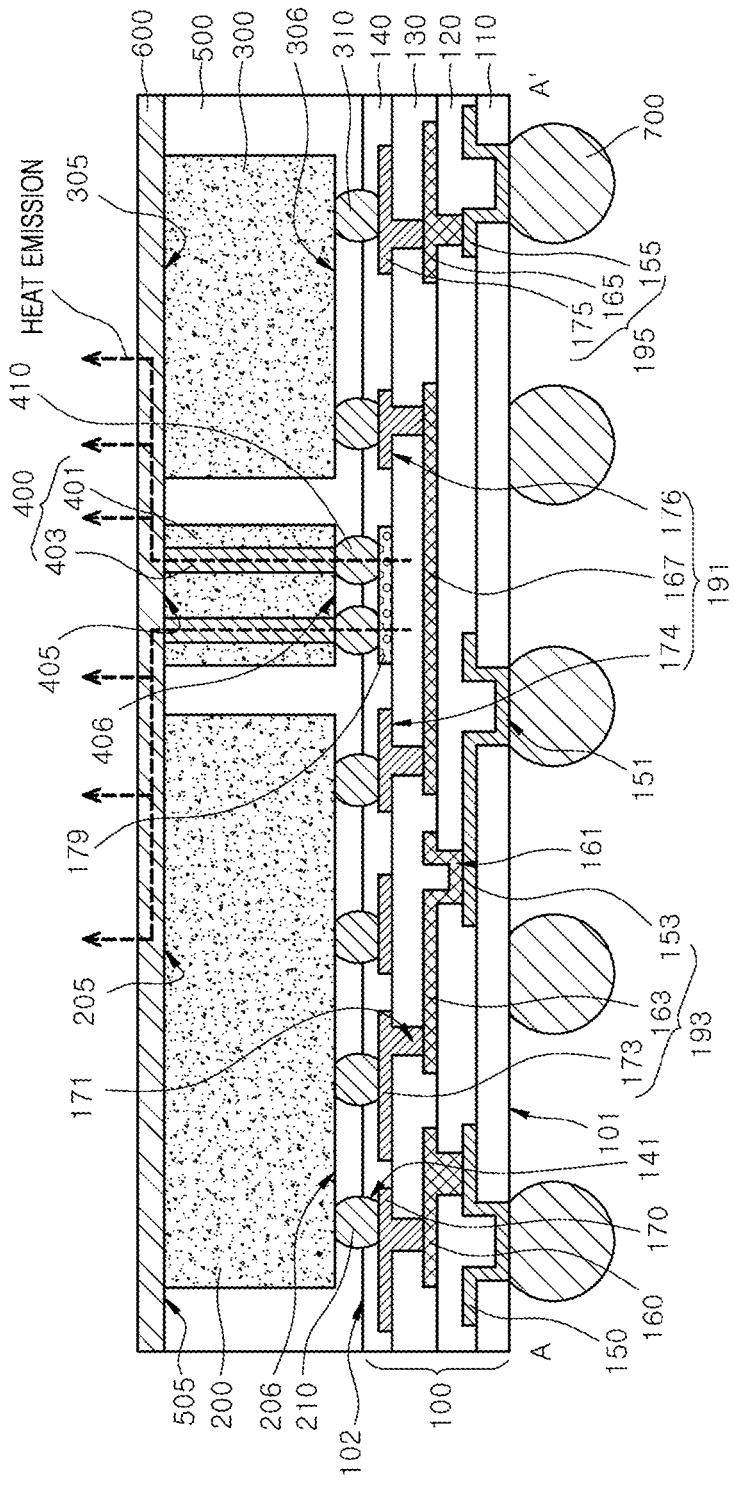

FIG. 1 is a plan view illustrating a semiconductor package 10 according to an embodiment, and FIG. 2 is a cross-sectional view taken along a line A-A' of FIG. 1.

Referring to FIGS. 1 and 2, the semiconductor package 10 may be configured to have an SIP structure including a first semiconductor chip 200 and a second semiconductor chip 300 which are disposed side-by-side to be laterally spaced apart from each other. In an embodiment, for example, the semiconductor package (i.e., 10, 20, 30, and 40) may be configured to include a first semiconductor chip (i.e., 200, 2200, 3200, 4200, 5200, 6200) and a second semiconductor chip (i.e., 300, 2300, 3300, 4300, 5300, 6300) laterally spaced apart from each other. The first semiconductor chip 200 and the second semiconductor chip 300 may have different functions. The first semiconductor chip 200 and the second semiconductor chip 300 may be protected by an encapsulant 500. The second semiconductor chip 300 may be a memory device that stores data or acts as a buffer device, and the first semiconductor chip 200 may be an arithmetic element (e.g., an application processor) performing a logical operation of the data stored in the second semiconductor chip 300.

Since a great number of data are transmitted between an application processor (i.e., the first semiconductor chip 200) and a memory device (i.e., the second semiconductor chip 300), a lot of heat may be generated from a region between the first and second semiconductor chips 200 and 300 due to the data communication between the first and second semiconductor chips 200 and 300. If the heat generated by the data communication between the first and second semiconductor chips 200 and 300 is trapped in the region between the first and second semiconductor chips 200 and 300, the first or second semiconductor chip 200 or 300 may be degraded by the heat trapped in the region between the first and second semiconductor chips 200 and 300. Since the first and second semiconductor chips 200 and 300 are not vertically stacked but laterally disposed side-by-side, a thickness of the semiconductor package 10 may be reduced. In such a case, the semiconductor package 10 may be easily warped by the heat generated in the semiconductor package 10 to cause cracks.

A heat transferring block 400 may be disposed between the first and second semiconductor chips 200 and 300 to efficiently emit the heat trapped or generated in the region between the first and second semiconductor chips 200 and 300 into an outside space of the semiconductor package 10. The heat transferring block 400 may include a block body 401 having a rectangular shape in a plan view and a plurality of through vias 403 vertically penetrating the block body 401. Spaces between the block body 401 and the first and second semiconductor chips 200 and 300 may be filled with the encapsulant 500.

The block body 401 may include a material having a thermal conductivity which is higher than a thermal conductivity of an epoxy molding compound (EMC) material or a polymer material. The block body 401 may include a semiconductor material such as a silicon material. In an embodiment, the block body 401 may be a single crystalline silicon chip or a single crystalline silicon die. While the EMC material has a thermal conductivity of about 2 W/mK to about 3 W/mK, the silicon material may have a thermal conductivity of about 149 W/mK. The block body 401 may be comprised of a material having substantially the same coefficient of thermal expansion as the first and second semiconductor chips 200 and 300. For example, if the first and second semiconductor chips 200 and 300 are manufactured using a semiconductor wafer such as a silicon wafer, the block body 401 may be comprised of a semiconductor material such as a silicon material. If a coefficient of thermal expansion of the block body 401 is similar to or substantially equal to a coefficient of thermal expansion of the first and second semiconductor chips 200 and 300, it is possible to effectively suppress that defects such as cracks are generated in the semiconductor package 10 by thermal stress which is due to a difference between thermal expansion coefficients of the block body 401 and the first and second semiconductor chips 200 and 300. In an embodiment, for example, the heat transferring block includes a material that is configured to minimize a difference between thermal expansion coefficients of the heat transferring block and the first and second semiconductor chips. In an embodiment, for example, the block body may 401 may include a material having a thermal conductivity which is higher than a thermal conductivity of the encapsulant 500. In an embodiment, for example, the encapsulant 500 may include an epoxy molding compound (EMC) material or a polymer material.

In an embodiment, the block body 401 may be a silicon dummy die, and the through vias 403 may be through silicon vias (TSVs) penetrating the silicon dummy die. The through vias 403 may be comprised of a metal material having a thermal conductivity which is higher than a thermal conductivity of the block body 401. For example, if the block body 401 is comprised of a silicon material, the through vias 403 may be comprised of a copper material. A copper material may have a thermal conductivity of about 385 W/mK which is higher than twice that of a silicon material. Since the heat transferring block 400 has a shape of a silicon dummy die, it may be easy to dispose the heat transferring block 400 between the first and second semiconductor chips 200 and 300. In an embodiment, for example, the block body 401 has a shape of a silicon die.

The through vias 403 may be formed to directly penetrate the encapsulant 500 disposed between the first and second semiconductor chips 200 and 300. However, molding or forming the encapsulant 500 after the heat transferring block 400 is disposed between the first and second semiconductor chips 200 and 300 may be more effective than forming the through vias 403 after the encapsulant 500 is formed to fill a space between the first and second semiconductor chips 200 and 300. In such a case, since a total amount of the encapsulant 500 can be reduced by the volume of the block body 401, the thermal deformation of the semiconductor package 10 may be suppressed. A difference between the thermal expansion coefficients of the encapsulant 500 and the first and second semiconductor chips 200 and 300 may cause a thermal stress significantly applied to the semiconductor package 10. Thus, a total amount of the encapsulant 500 is reduced, the thermal stress applied to the semiconductor package 10 may also be reduced.

The heat transferring block 400 may have a width which is greater than widths of the first and second semiconductor chips 200 and 300 in a certain direction. If the first and second semiconductor chips 200 and 300 are chips having different functions, the first and second semiconductor chips 200 and 300 may have different sizes when viewed from a plan view of FIG. 1. For example, if the first and second semiconductor chips 200 and 300 respectively have a first width B1 and a second width B2 in a direction substantially perpendicular to the cut line A-A', the heat transferring block 400 may have a third width BC which is greater than the first and second widths B1 and B2. If the third width BC of the transferring block 400 increases, a ratio of a volume of the heat transferring block 400 to a total volume of the semiconductor package 10 may also increase to improve a heat emission efficiency of the semiconductor package 10.

Referring again to FIGS. 1 and 2, the first and second semiconductor chips 200 and 300 may be disposed on an interconnection layer 100. The second semiconductor chip 300 may be configured to have a semiconductor package structure including a plurality of memory dies which are vertically stacked on a portion of the interconnection layer 100. The plurality of memory dies of the second semiconductor chip 300 may be electrically connected to each other by an interconnection structure including TSVs. The second semiconductor chip 300 may include high bandwidth memory (HBM) devices. The first semiconductor chip 200 may include an application processor performing a graphic operation or a program operation with data stored in the second semiconductor chip 300.

The interconnection layer 100 may provide paths connecting the first or second semiconductor chip 200 or 300 to an external device and/or paths used in data communication between the first and second semiconductor chip 200 and 300. Outer connectors 700 may be attached to a first surface 101 of the interconnection layer 100 to electrically or signally connect the first or second semiconductor chip 200 or 300 to an external device. The outer connectors 700 may have one of various shapes. For example, the outer connectors 700 may be solder balls. In an embodiment, for example, the first semiconductor chip 200 may include an application processor chip. In an embodiment, for example, the second semiconductor chip 300 may include a memory device receiving data from the first semiconductor chip 200 or outputting data to the first semiconductor chip 200.

The first and second semiconductor chip 200 and 300 may be disposed side-by-side on a second surface 102 of the interconnection layer 100 opposite to the outer connectors 700 in order to reduce a thickness of the semiconductor package 10. The interconnection layer 100 may include a plurality of dielectric layers (e.g., first to fourth dielectric layers 110, 120, 130 and 140) which are sequentially stacked as well as redistributed patterns (e.g., first to third redistributed patterns 150, 160 and 170) which are disposed between the dielectric layers 110, 120, 130 and 140.

The dielectric layers 110, 120, 130 and 140 may be comprised of the same dielectric layer or at least two different dielectric materials. For example, the dielectric layers 110, 120, 130 and 140 may be comprised of at least one of an interlayer dielectric (ILD) material, an inter-metal dielectric (IMD) material, a polymer material such as a polyimide material, a silicon oxide material and a silicon nitride material. The dielectric layers 110, 120, 130 and 140 may be laminated, sequentially deposited or coated.

The redistributed patterns 150, 160 and 170 may be formed by depositing a conductive material such as metal material, for example, a copper material and by etching the conductive material with etch masks. Alternatively, the redistributed patterns 150, 160 and 170 may be formed using a selective plating technique with plating masks.

Each of the dielectric layers 110, 120, 130 and 140 constituting the interconnection layer 100 may have a thickness of at most ten micrometers, for example, a few micrometers, and a total thickness of the interconnection layer 100 may be several tens of micrometers. Since the interconnection layer 100 has a thickness which is less than a thickness of a general printed circuit board (PCB), a total thickness of the semiconductor package 10 may be reduced.

The outer connectors 700 may be disposed on the first dielectric layer 110 of the interconnection layer 100, and the first redistributed patterns 150 may be disposed between the first and second dielectric layers 110 and 120. At least one of the first redistributed patterns 150 may have a first connecting portion 151, and the first connecting portion 151 may extend to penetrate the first dielectric layer 110. The first connecting portion 151 of the first redistributed pattern 150 may correspond to a via penetrating the first dielectric layer 110. A surface of the first dielectric layer 110 opposite to the second dielectric layer 120 may correspond to the first surface 101 of the interconnection layer 100. Thus, a portion of the first connecting portion 151 may be exposed at the first surface 101 of the interconnection layer 100. The outer connectors 700 may be bonded to the exposed portions of the first connecting portions 151 of the first redistributed patterns 150, respectively.

The interconnection layer 100 may include the second dielectric layer 120 stacked on the first dielectric layer 110. The first redistributed patterns 150 may be disposed between the first and second dielectric layers 110 and 120. The interconnection layer 100 may also include the second redistributed patterns 160 disposed on a surface of the second dielectric layer 120. At least one of the second redistributed patterns 160 may have a second connecting portion 161, and the second connecting portion 161 may extend to penetrate the second dielectric layer 120. The second connecting portion 161 of the second redistributed pattern 160 may correspond to a via penetrating the second dielectric layer 120. The second connecting portions 161 of the second redistributed patterns 160 may be connected or bonded to the first redistributed patterns 150, respectively.

The interconnection layer 100 may include the third dielectric layer 130 stacked on the second dielectric layer 120. The second redistributed patterns 160 may be disposed between the second and third dielectric layers 120 and 130. The interconnection layer 100 may also include the third redistributed patterns 170 disposed on a surface of the third dielectric layer 130. At least one of the third redistributed patterns 170 may have a third connecting portion 171, and the third connecting portion 171 may extend to penetrate the third dielectric layer 130. The third connecting portion 171 of the third redistributed pattern 170 may correspond to a via penetrating the third dielectric layer 130. The third connecting portions 171 of the third redistributed patterns 170 may be connected or bonded to the second redistributed patterns 160, respectively.

The interconnection layer 100 may include the fourth dielectric layer 140 stacked on the third dielectric layer 130. The fourth dielectric layer 140 may correspond to a topmost layer of the interconnection layer 100, and a surface of the fourth dielectric layer 140 opposite to the third dielectric layer 130 may correspond to the second surface 102 of the interconnection layer 100. Openings 141 penetrating the fourth dielectric layer 140 may be provided to expose portions of the third redistributed patterns 170, respectively. For example, the fourth dielectric layer 140 may be formed to include a polymer material such as a solder resist material, and portions of the fourth dielectric layer 140 may be selectively exposed and developed using a photolithography process to form the openings 141 that expose the portions of the third redistributed patterns 170.

Although FIG. 2 illustrates an example in which the interconnection layer 100 includes the first to third redistributed patterns 150, 160 and 170 located at three different levels, the present disclosure is not limited thereto. For example, the interconnection layer 100 may be configured to include redistributed patterns which are located at a single level, at two different levels or at least four different levels.

The first semiconductor chip 200 may be disposed on the second surface 102 of the interconnection layer 100 and may be bonded to some of the third redistributed patterns 170 using first inner connectors 210. The first inner connectors 210 may be respectively inserted into some of the openings 141 and may be bonded to some of the third redistributed patterns 170 to electrically connect the first semiconductor chip 200 to some of the third redistributed patterns 170. The first inner connectors 210 may be connection members having a fine size, for example, micro-bumps. The first semiconductor chip 200 may have a third surface 205 corresponding to a backside surface and a fourth surface 206 corresponding to a front side surface. The first semiconductor chip 200 may be a flip chip. Accordingly, the first semiconductor chip 200 may be bonded to the first inner connectors 210 so that the fourth surface 206 of the first semiconductor chip 200 faces the second surface 102 of the interconnection layer 100. In an embodiment, for example, a first group of the third redistributed patterns 170 are coupled to the first semiconductor chip 200 through for example, first inter connectors 210, and a second group of the third redistributed patterns 170 are coupled to the second semiconductor chip 300 through for example, second inter connectors 310. In an embodiment, for example, a first group of the third redistributed patterns 170 are connected to the first semiconductor chip 200, and a second group of the third redistributed patterns 170 are connected to the second semiconductor chip 300.

The second semiconductor chip 300 may be disposed to be laterally spaced apart from the first semiconductor chip 200 and may be bonded to the remaining patterns of the third redistributed patterns 170 using second inner connectors 310. The second inner connectors 310 may be respectively inserted into the remaining openings 141 and may be bonded to the remaining patterns of the third redistributed patterns 170 to electrically connect the second semiconductor chip 300 to the remaining patterns of the third redistributed patterns 170. The second inner connectors 310 may be connection members having a fine size, for example, micro-bumps. The second semiconductor chip 300 may have a fifth surface 305 corresponding to a backside surface and a sixth surface 306 corresponding to a front side surface. The second semiconductor chip 300 may be a flip chip. Accordingly, the second semiconductor chip 300 may be bonded to the second inner connectors 310 so that the sixth surface 306 of the second semiconductor chip 300 faces the second surface 102 of the interconnection layer 100.

The first semiconductor chip 200 may be electrically connected to some of the outer connectors 700 through first paths 193, each of which includes any one pattern 173 of the third redistributed patterns 170 connected to one of the first inner connectors 210, any one pattern 163 of the second redistributed patterns 160 connected to the pattern 173 through the third connecting portion 171, and any one pattern 153 of the first redistributed patterns 150 connected to the pattern 163 through the second connecting portion 161, even without using any other paths connected to the second semiconductor chip 300. The second semiconductor chip 300 may be electrically connected to the remaining outer connectors 700 through second paths 195, each of which includes any one pattern 175 of the third redistributed patterns 170 connected to one of the second inner connectors 310, any one pattern 165 of the second redistributed patterns 160 connected to the pattern 175, and any one pattern 155 of the first redistributed patterns 150 connected to the pattern 165, even without using any other paths connected to the first semiconductor chip 200.

The first and second semiconductor chips 200 and 300 may be electrically connected to each other through a third path 191 including one pattern 174 of the third redistributed patterns 170 connected to one of the first inner connectors 210, another pattern 176 of the third redistributed patterns 170 connected to one of the second inner connectors 310, and any one pattern 167 of the second redistributed patterns 160 connecting the pattern 174 to the pattern 176. The pattern 167 may have a first end overlapping with the first semiconductor chip 200, a second end overlapping with the second semiconductor chip 300, and a central portion overlapping with the heat transferring block 400. The third path 191 may correspond to an interfacing path between the first and second semiconductor chips 200 and 300. In an embodiment, for example, an end of the at least one of the second redistributed patterns 160 overlaps with an end of the first semiconductor chip 200, and the other end of the at least one of the second redistributed patterns 160 overlaps with an end of the second semiconductor chip 300.

A heat sink pattern 179 may be disposed over the third path 191 that transmits data to execute the data communication between the first and second semiconductor chips 200 and 300. The heat sink pattern 179 may be embedded in the interconnection layer 100 to overlap with the pattern 167 of the second redistributed patterns 160. The heat sink pattern 179 may be disposed to be laterally spaced apart from the patterns 174 and 176 of the third redistributed patterns 170 may be located at the same level as the patterns 174 and 176. The heat sink pattern 179 may be disposed to emit the heat generated in the interconnection layer 100. If a great number of data are transmitted through the third path 191 between the first and second semiconductor chips 200 and 300 at a high speed, a lot of heat may be generated from the third path 191. In order to efficiently collect the heat generated from the third path 191, the heat sink pattern 179 may be disposed to overlap with at least the pattern 167 of the second redistributed patterns 160. The heat sink pattern 179 may correspond to one of the third redistributed patterns 170. The heat sink pattern 179 may correspond to a dummy pattern which is electrically disconnected to the first and second semiconductor chips 200 and 300.

The heat transferring block 400 may be disposed between the first and second semiconductor chips 200 and 300 which are arrayed on the second surface 102 of the interconnection layer 100. The heat transferring block 400 may be disposed to be laterally spaced apart from the first and second semiconductor chips 200 and 300 by a certain distance and may be bonded to the heat sink pattern 179 using third inner connectors 410. Some of the openings 141 penetrating the fourth dielectric layer 140 may be formed to expose portions of the heat sink pattern 179. The third inner connectors 410 may be respectively inserted into some of the openings 141 and may be bonded to the heat sink pattern 179. The third inner connectors 410 may be connection members having a fine size, for example, micro-bumps. The third inner connectors 410 may be bumps having substantially the same size and shape as the first or second inner connectors 210 or 310. In an embodiment, for example, the heat transferring block 400 is coupled to the heat sink pattern 179 through, for example, third inner connectors 410. In an embodiment, for example, the heat transferring block 400 is connected to the heat sink pattern 179.

The heat transferring block 400 may have a seventh surface 405 corresponding to a backside surface and an eighth surface 406 corresponding to a front side surface. The heat transferring block 400 may be bonded to the interconnection layer 100 so that the eighth surface 406 of the heat transferring block 400 faces the second surface 102 of the interconnection layer 100. Each of the through vias 403 may penetrate the block body 401 of the heat transferring block 400 so that both ends of each of the through vias 403 are exposed at the seventh and eighth surfaces 405 and 406. First ends of the through vias 403 exposed at the eighth surface 406 of the block body 401 may be combined with portions of the heat sink pattern 179 exposed by the openings 141 of the fourth dielectric layer 140 through the third inner connectors 410. Thus, heat collected into the heat sink pattern 179 may be conducted to the seventh surface 405 of the block body 401 through the third inner connectors 410 and the through vias 403.

Since the block body 401 as well as the through vias 403 also has a thermal conductivity which is higher than a thermal conductivity of the encapsulant 500, the heat of the heat sink pattern 179 may be efficiently emitted into an outside space of the semiconductor package 10. In addition, since the heat transferring block 400 is disposed between the first and second semiconductor chips 200 and 300, the heat generated by data communication between the first and second semiconductor chips 200 and 300 may be absorbed or collected into the block body 401 of the heat transferring block 400. The heat transferring block 400 may provide a path conducting the heat collected into the heat sink pattern 179 and may also act as a heat sink.

As described with reference to FIG. 1, the heat transferring block 400 may have the third width BC which is greater than the first and second widths B1 and B2 of the first and second semiconductor chips 200 and 300 in a direction substantially perpendicular to the cut line A-A'. The heat sink pattern 179 connected to the heat transferring block 400 may be disposed to overlap with an entire portion of the heat transferring block 400 when viewed from a plan view. The heat sink pattern 179 may correspond to a pad pattern or a blanket pattern that overlaps with the heat transferring block 400.

The semiconductor package 10 may include the encapsulant 500 that covers sidewalls of the first and second semiconductor chips 200 and 300 and fills spaces between the first semiconductor chip 200 and the heat transferring block 400 as well as between the second semiconductor chip 300 and the heat transferring block 400. The encapsulant 500 may extend to fill gaps between the second surface 102 of the interconnection layer 100 and the semiconductor chips 200 and 300 as well as between the second surface 102 of the interconnection layer 100 and the heat transferring block 400. The encapsulant 500 may be formed so that the third surface 205 of the first semiconductor chip 200, the fifth surface 305 of the second semiconductor chip 300 and the seventh surface 405 of the heat transferring block 400 are exposed at a ninth surface 505 corresponding to a top surface of the encapsulant 500.

The semiconductor package 10 may include a heat dissipation layer 600 which is directly attached to the seventh surface 405 of the heat transferring block 400 that is exposed at the ninth surface 505 of the encapsulant 500. The heat dissipation layer 600 may be formed of a metal material to radiate and dissipate heat generated in the semiconductor package 10. The heat dissipation layer 600 may be formed by depositing or plating a metal material.

The heat dissipation layer 600 may be directly combined with or directly connected to the seventh surface 405 of the heat transferring block 400 and may directly combined with or directly bonded to ends of the through vias 403 exposed at the seventh surface 405 of the heat transferring block 400. The block body 401 of the heat transferring block 400 may have the seventh surface 405 corresponding to a top surface facing the heat dissipation layer 600 and the eighth surface 406 corresponding to a bottom surface facing the interconnection layer 100. Upper ends of the through vias 403 may be exposed at the seventh surface 405 of the block body 401, and lower ends of the through vias 403 may be exposed at the eighth surface 406 of the block body 401.

The heat dissipation layer 600 may extend onto the first and second semiconductor chips 200 and 300 and the encapsulant 500. If the heat dissipation layer 600 extends to be in direct contact with or to be directly combined with the third surface 205 of the first semiconductor chip 200, the heat generated in the first semiconductor chip 200 may be radiated or emitted through the heat dissipation layer 600. If the heat dissipation layer 600 extends to be in direct contact with or to be directly combined with the fifth surface 505 of the second semiconductor chip 300, the heat generated in the second semiconductor chip 300 may be radiated or emitted through the heat dissipation layer 600.

If the heat dissipation layer 600 extends to substantially cover all of the top surfaces 505, 205, 405 and 305 of the encapsulant 500, the first semiconductor chip 200, the heat transferring block 400 and the second semiconductor chip 300, the heat dissipation layer 600 including a metal material may act as a reinforcing member or a supporting member that suppresses warpage of the semiconductor package 10. That is, the heat dissipation layer 600 may effectively suppress the warpage of the semiconductor package 10.

In order that the heat dissipation layer 600 is in direct contact with the third surface 205 of the first semiconductor chip 200 and the fifth surface 305 of the second semiconductor chip 300, all of the third surface 205 of the first semiconductor chip 200, the fifth surface 305 of the second semiconductor chip 300, the seventh surface 405 of the heat transferring block 400, and the ninth surface 505 of the encapsulant 500 have to be located at substantially the same level to constitute a single flat surface without an uneven surface profile.

Figure 3:
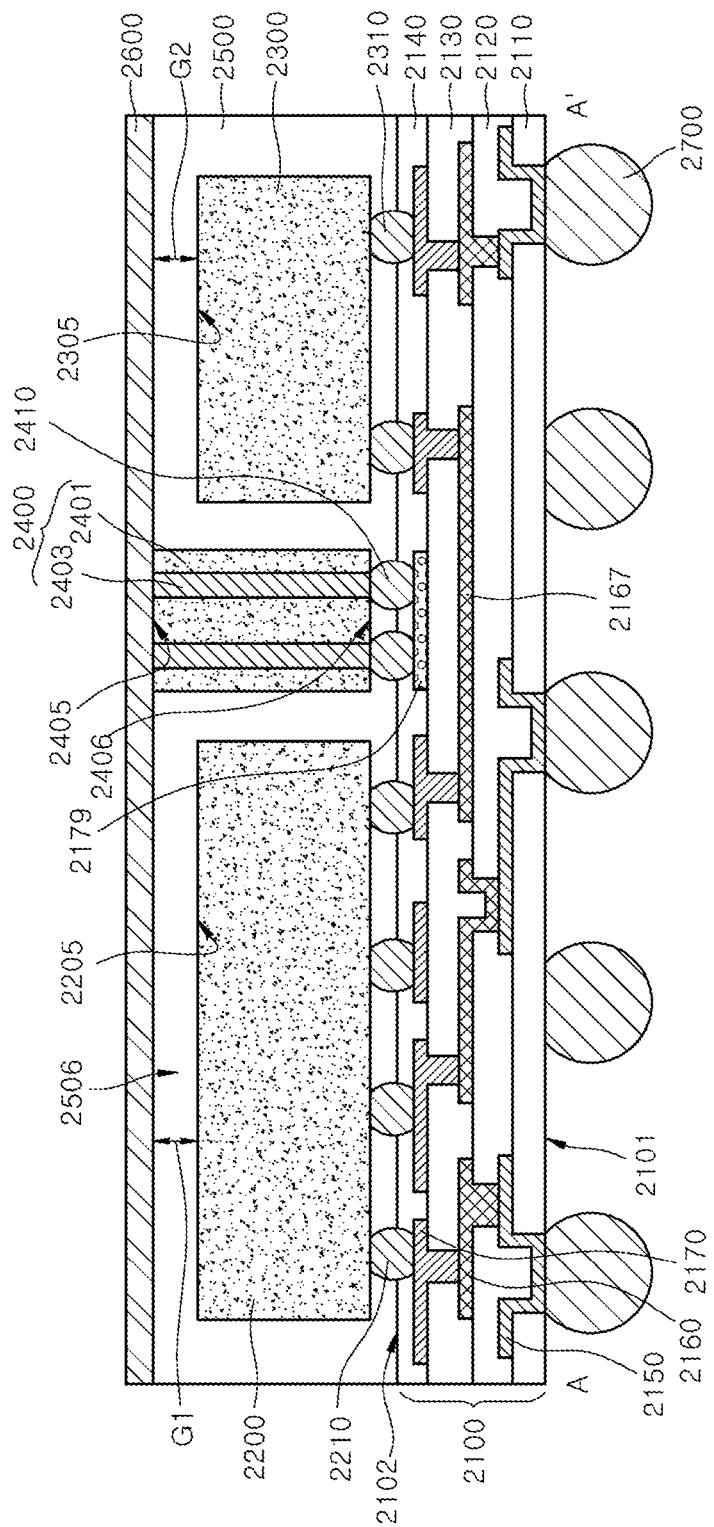
FIG. 3 is a cross-sectional view illustrating a semiconductor package according to an embodiment.

FIG. 3 is a cross-sectional view illustrating a semiconductor package 20 according to other embodiments.

Referring to FIG. 3, the semiconductor package 20 may be configured to have an SIP structure including a first semiconductor chip 2200 and a second semiconductor chip 2300 which are disposed side-by-side on a second surface 2102 of an interconnection layer 2100 to be laterally spaced apart from each other. The first semiconductor chip 2200 and the second semiconductor chip 2300 may have different functions. The first semiconductor chip 2200 and the second semiconductor chip 2300 may be protected by an encapsulant 2500.

A heat transferring block 2400 may be disposed between the first and second semiconductor chips 2200 and 2300 to efficiently emit the heat trapped or generated in a region between the first and second semiconductor chips 2200 and 2300 into an outside space of the semiconductor package 20. The heat transferring block 2400 may include a block body 2401 having a rectangular shape in a plan view and a plurality of through vias 2403 vertically penetrating the block body 2401.

The interconnection layer 2100 may provide paths connecting the first or second semiconductor chip 2200 or 2300 to an external device and/or paths used in data communication between the first and second semiconductor chip 2200 and 2300. Outer connectors 2700 may be attached to a first surface 2101 of the interconnection layer 2100 to electrically or signally connect the first or second semiconductor chip 2200 or 2300 to an external device. The interconnection layer 2100 may include first to fourth dielectric layers 2110, 2120, 2130 and 2140 which are sequentially stacked as well as first to third redistributed patterns 2150, 2160 and 2170 which are disposed between the dielectric layers 2110, 2120, 2130 and 2140.

The first semiconductor chip 2200 may be bonded to the second surface 2102 of the interconnection layer 2100 using first inner connectors 2210. The second semiconductor chip 2300 may be bonded to the second surface 2102 of the interconnection layer 2100 using second inner connectors 2310.

A heat sink pattern 2179 may be disposed over a third pattern 2167 of the second redistributed patterns 2160. The third pattern 2167 of the second redistributed patterns 2160 may transmit data to execute data communication between the first and second semiconductor chips 2200 and 2300. The heat sink pattern 2179 may be disposed to emit the heat generated in the interconnection layer 2100. The heat transferring block 2400 may be disposed between the first and second semiconductor chips 2200 and 2300 which are located on the second surface 2102 of the interconnection layer 2100. The heat transferring block 2400 may be connected or bonded to the heat sink pattern 2179 using third inner connectors 2410.

The heat transferring block 2400 may have a seventh surface 2405 corresponding to a backside surface and an eighth surface 2406 corresponding to a front side surface. The heat transferring block 2400 may be bonded to the interconnection layer 2100 so that the eighth surface 2406 of the heat transferring block 2400 faces the second surface 2102 of the interconnection layer 2100. The heat transferring block 2400 may have a thickness which is greater than a thickness of the first and second semiconductor chips 2200 and 2300. Thus, the seventh surface 2405 of the heat transferring block 2400 may be located at a level which is higher than a level of a third surface 2205 corresponding to a top surface of the first semiconductor chip 2200 and a level of a fifth surface 2305 corresponding to a top surface of the second semiconductor chip 2300.

The semiconductor package 20 may include a heat dissipation layer 2600 which is directly attached to the seventh surface 2405 of the heat transferring block 2400. A portion 2506 of the encapsulant 2500 may fill a first gap G1 between the first semiconductor chip 2200 and the heat dissipation layer 2600 as well as a second gap G2 between the second semiconductor chip 2300 and the heat dissipation layer 2600. The portion 2506 of the encapsulant 2500 may physically separate the first semiconductor chip 2200 and the heat dissipation layer 2600 and may physically separate the second semiconductor chip 2300 and the heat dissipation layer 2600. That is, the first and second semiconductor chips 2200 and 2300 may be electrically isolated and insulated from the heat dissipation layer 2600 by the portion 2506 of the encapsulant 2500.

Figure 4:
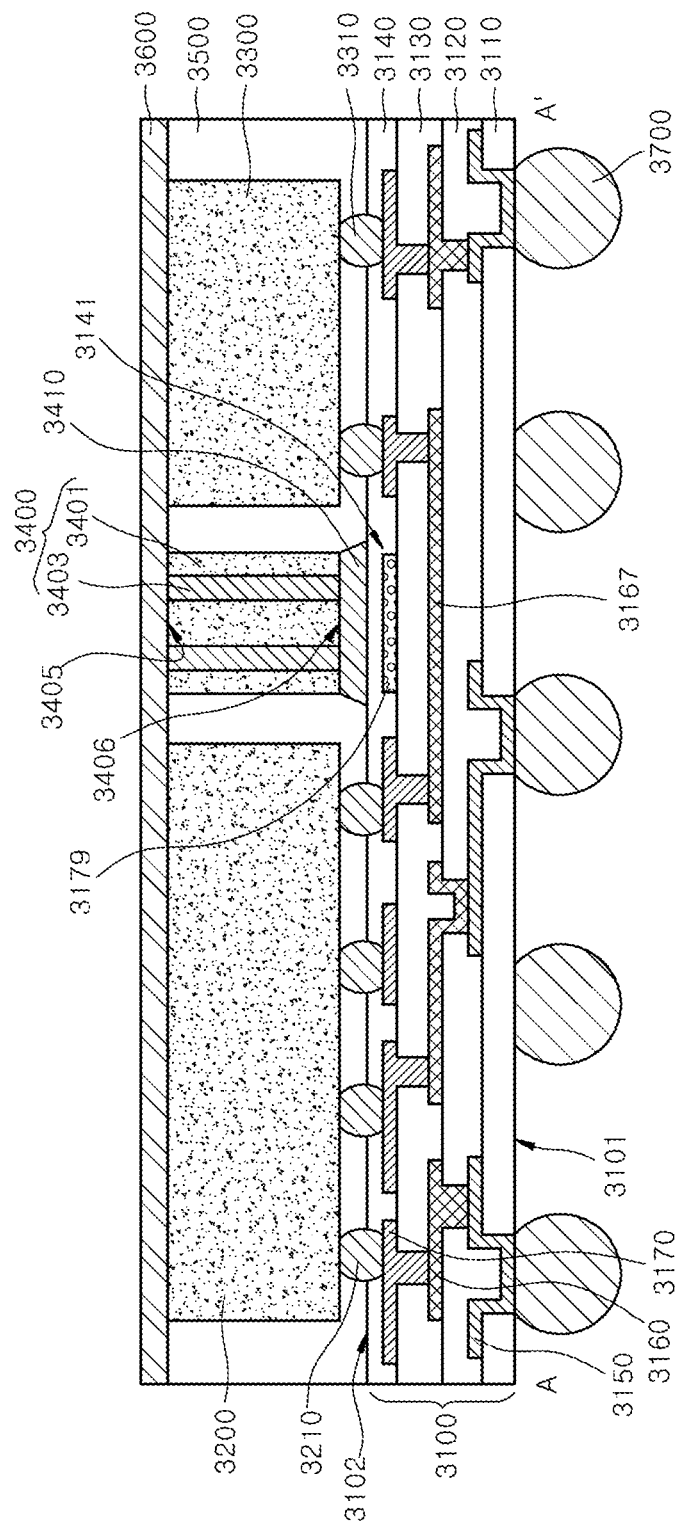
FIG. 4 is a cross-sectional view illustrating a semiconductor package according to an embodiment.

FIG. 4 is a cross-sectional view illustrating a semiconductor package 30 according to other embodiments.

Referring to FIG. 4, the semiconductor package 30 may be configured to have an SIP structure including a first semiconductor chip 3200 and a second semiconductor chip 3300 which are disposed side-by-side on a second surface 3102 of an interconnection layer 3100 to be laterally spaced apart from each other. The first semiconductor chip 3200 and the second semiconductor chip 3300 may have different functions. The first semiconductor chip 3200 and the second semiconductor chip 3300 may be protected by an encapsulant 3500.

A heat transferring block 3400 may be disposed between the first and second semiconductor chips 3200 and 3300 to efficiently emit the heat trapped or generated in a region between the first and second semiconductor chips 3200 and 3300 into an outside space of the semiconductor package 30. The heat transferring block 3400 may include a block body 3401 having a rectangular shape in a plan view and a plurality of through vias 3403 vertically penetrating the block body 3401.

The interconnection layer 3100 may provide paths connecting the first or second semiconductor chip 3200 or 3300 to an external device and/or paths used in data communication between the first and second semiconductor chip 3200 and 3300. Outer connectors 3700 may be attached to a first surface 3101 of the interconnection layer 3100 to electrically or signally connect the first or second semiconductor chip 3200 or 3300 to an external device. The interconnection layer 3100 may include first to fourth dielectric layers 3110, 3120, 3130 and 3140 which are sequentially stacked as well as first to third redistributed patterns 3150, 3160 and 3170 which are disposed between the dielectric layers 3110, 3120, 3130 and 3140.

The first semiconductor chip 3200 may be bonded to the second surface 3102 of the interconnection layer 3100 using first inner connectors 3210. The second semiconductor chip 3300 may be bonded to the second surface 3102 of the interconnection layer 3100 using second inner connectors 3310.

A heat sink pattern 3179 may be disposed over a third pattern 3167 of the second redistributed patterns 3160 as a dummy pattern. The third pattern 3167 of the second redistributed patterns 3160 may transmit data to execute data communication between the first and second semiconductor chips 3200 and 3300. The heat transferring block 3400 may be disposed between the first and second semiconductor chips 3200 and 3300 which are located on the second surface 3102 of the interconnection layer 3100. The heat transferring block 3400 may have a seventh surface 3405 corresponding to a backside surface and an eighth surface 3406 corresponding to a front side surface. The eighth surface 3406 of the heat transferring block 3400 may be bonded to a portion 3141 of the fourth dielectric layer 3140, which is located over the heat sink pattern 3179, using an adhesive layer 3410. The adhesive layer 3410 may include a thermal interface material. The adhesive layer 3410 may be formed to have a thickness which is less than 10 micrometers. The heat sink pattern 3179 may be disposed between the adhesive layer 3410 and the third pattern 3167 of the second redistributed patterns 3160 to efficiently conduct the heat generated in the third pattern 3167 of the second redistributed patterns 3160 to the heat transferring block 3400. The semiconductor package 30 may include a heat dissipation layer 3600 which is directly attached to the seventh surface 3405 of the heat transferring block 3400.

Figure 5:
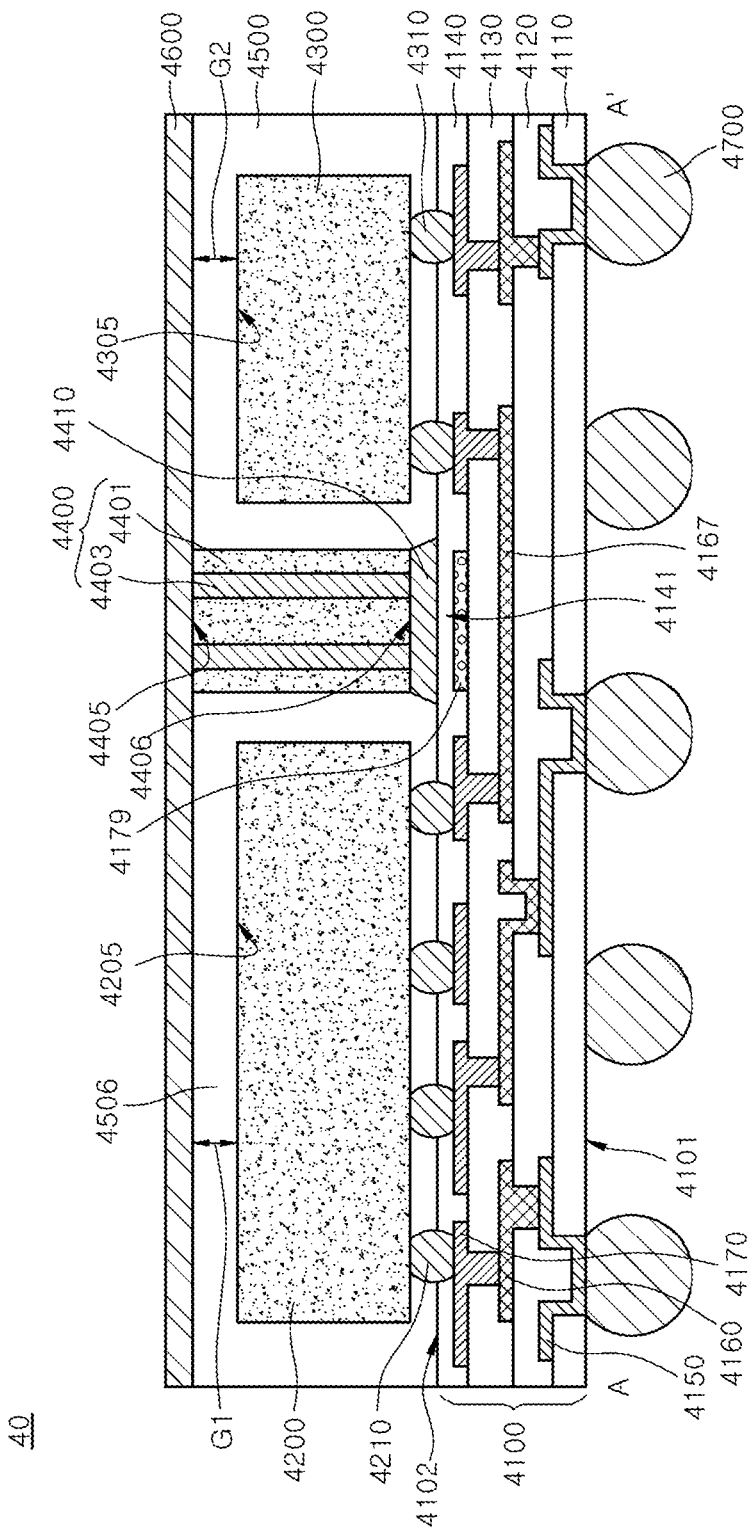
FIG. 5 is a cross-sectional view illustrating a semiconductor package according to an embodiment.

FIG. 5 is a cross-sectional view illustrating a semiconductor package 40 according to other embodiments.

Referring to FIG. 5, the semiconductor package 40 may be configured to have an SIP structure including a first semiconductor chip 4200 and a second semiconductor chip 4300 which are disposed side-by-side on a second surface 4102 of an interconnection layer 4100 to be laterally spaced apart from each other. The first semiconductor chip 4200 and the second semiconductor chip 4300 may have different functions. The first semiconductor chip 4200 and the second semiconductor chip 4300 may be protected by an encapsulant 4500.

A heat transferring block 4400 may be disposed between the first and second semiconductor chips 4200 and 4300 to efficiently emit the heat trapped or generated in a region between the first and second semiconductor chips 4200 and 4300 into an outside space of the semiconductor package 40. The heat transferring block 4400 may include a block body 4401 having a rectangular shape in a plan view and a plurality of through vias 4403 vertically penetrating the block body 4401.

The interconnection layer 4100 may provide paths connecting the first or second semiconductor chip 4200 or 4300 to an external device and/or paths used in data communication between the first and second semiconductor chip 4200 and 4300. Outer connectors 4700 may be attached to a first surface 4101 of the interconnection layer 4100 to electrically or signally connect the first or second semiconductor chip 4200 or 4300 to an external device. The interconnection layer 4100 may include first to fourth dielectric layers 4110, 4120, 4130 and 4140 which are sequentially stacked and first to third redistributed patterns 4150, 4160 and 4170 which are disposed between the dielectric layers 4110, 4120, 4130 and 4140.

The first semiconductor chip 4200 may be bonded to the second surface 4102 of the interconnection layer 4100 using first inner connectors 4210. The second semiconductor chip 4300 may be bonded to the second surface 4102 of the interconnection layer 4100 using second inner connectors 4310.

A heat sink pattern 4179 may be disposed over a third pattern 4167 of the second redistributed patterns 4160 as a dummy pattern. The third pattern 4167 of the second redistributed patterns 4160 may transmit data to execute data communication between the first and second semiconductor chips 4200 and 4300. The heat transferring block 4400 may be disposed between the first and second semiconductor chips 4200 and 4300 which are located on the second surface 4102 of the interconnection layer 4100. The heat transferring block 4400 may have a seventh surface 4405 corresponding to a backside surface and an eighth surface 4406 corresponding to a front side surface. The eighth surface 4406 of the heat transferring block 4400 may be bonded to a portion 4141 of the fourth dielectric layer 4140, which is located over the heat sink pattern 4179, using an adhesive layer 4410.

The heat transferring block 4400 may have a thickness which is greater than a thickness of the first and second semiconductor chips 4200 and 4300. Thus, the seventh surface 4405 of the heat transferring block 4400 may be located at a level which is higher than a level of a third surface 4205 corresponding to a top surface of the first semiconductor chip 4200 and a level of a fifth surface 4305 corresponding to a top surface of the second semiconductor chip 4300.

The semiconductor package 40 may include a heat dissipation layer 4600 which is directly attached to the seventh surface 4405 of the heat transferring block 4400. A portion 4506 of the encapsulant 4500 may fill a first gap G1 between the first semiconductor chip 4200 and the heat dissipation layer 4600 as well as a second gap G2 between the second semiconductor chip 4300 and the heat dissipation layer 4600. The portion 4506 of the encapsulant 4500 may physically separate the first semiconductor chip 4200 and the heat dissipation layer 4600 and may physically separate the second semiconductor chip 4300 and the heat dissipation layer 4600. That is, the first and second semiconductor chips 4200 and 4300 may be electrically isolated and insulated from the heat dissipation layer 4600 by the portion 4506 of the encapsulant 4500.

Figure 6:
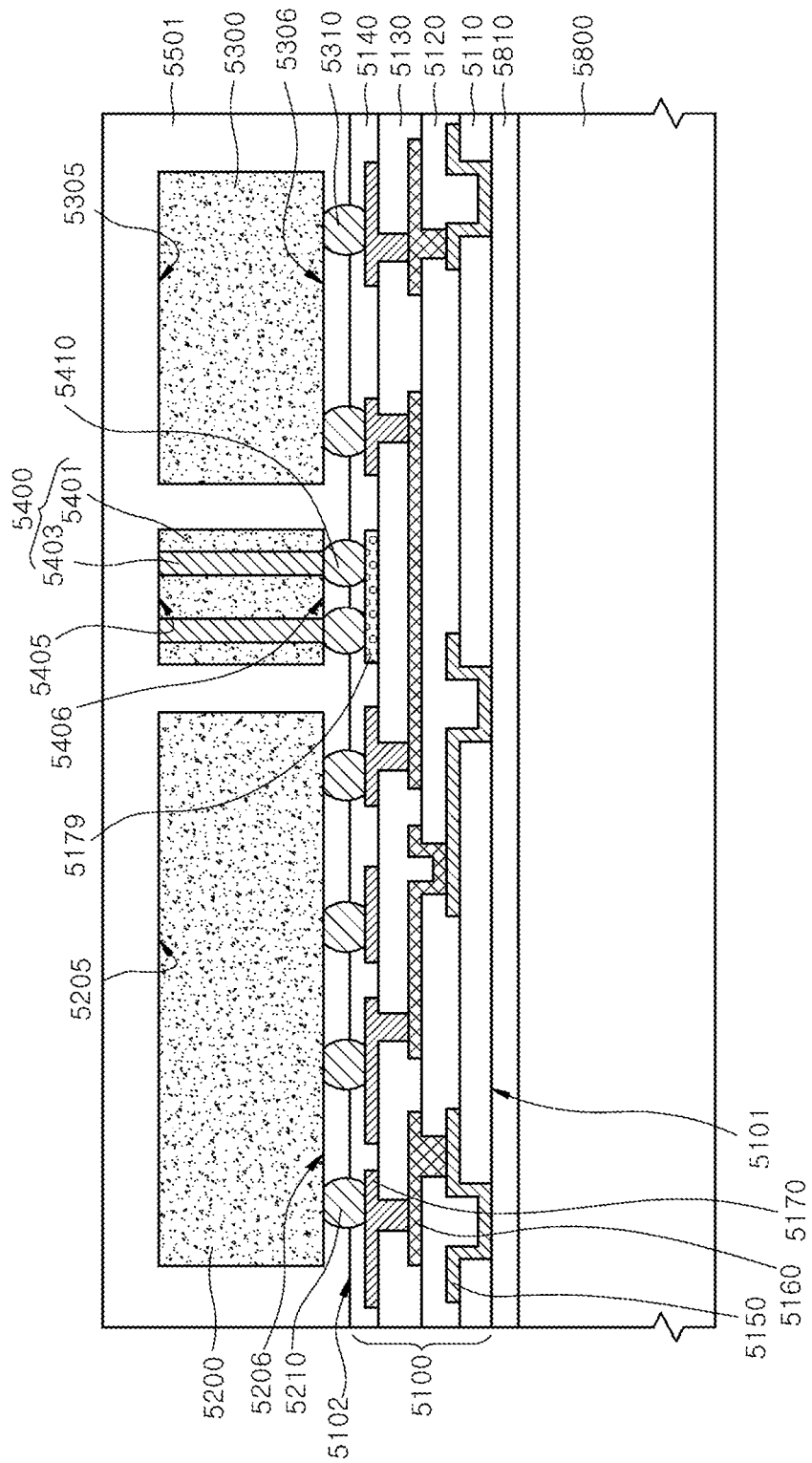
FIGS. 6 to 8 are cross-sectional views illustrating a method of manufacturing a semiconductor package according to an embodiment.
Figure 7:
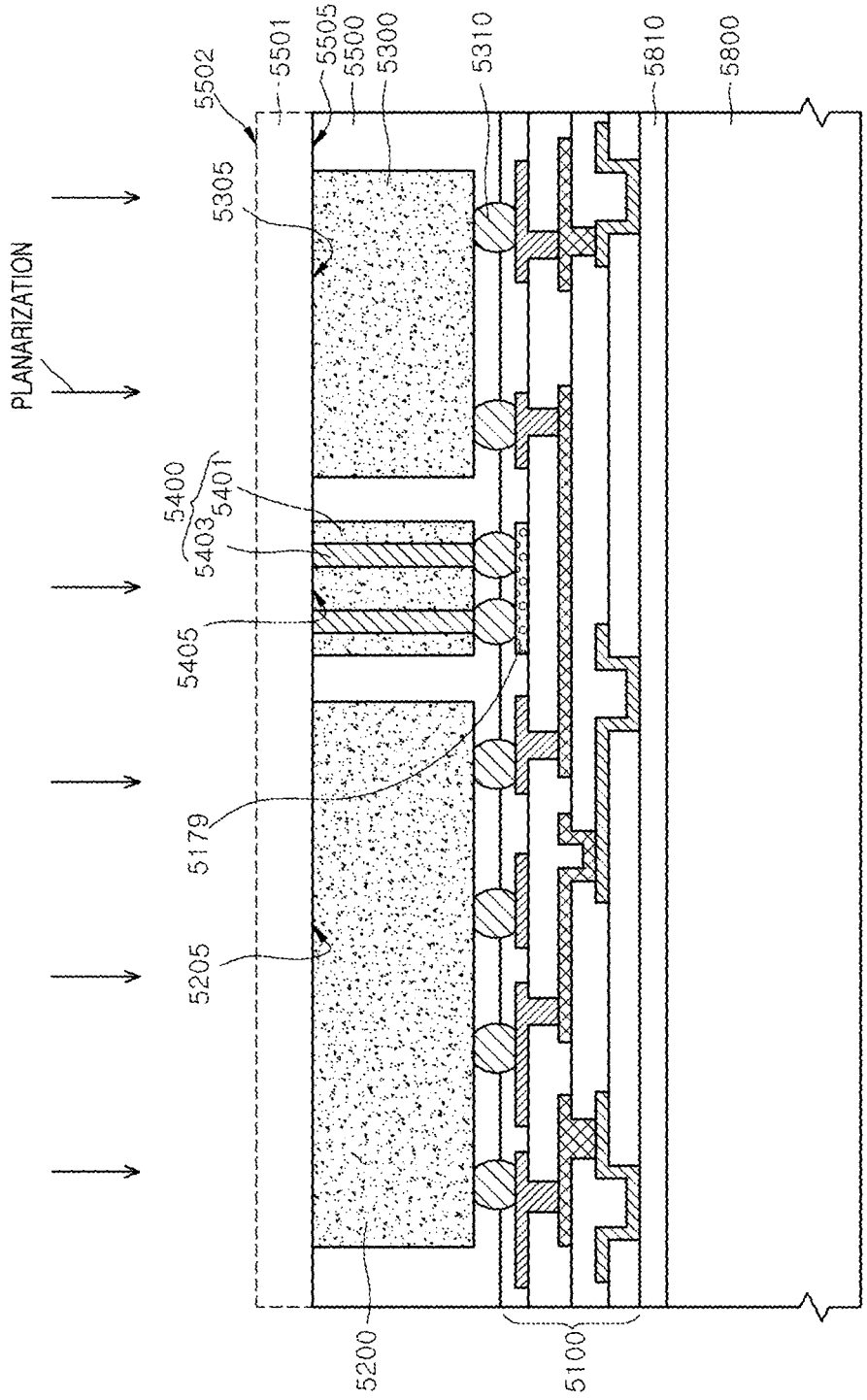
Figure 8:
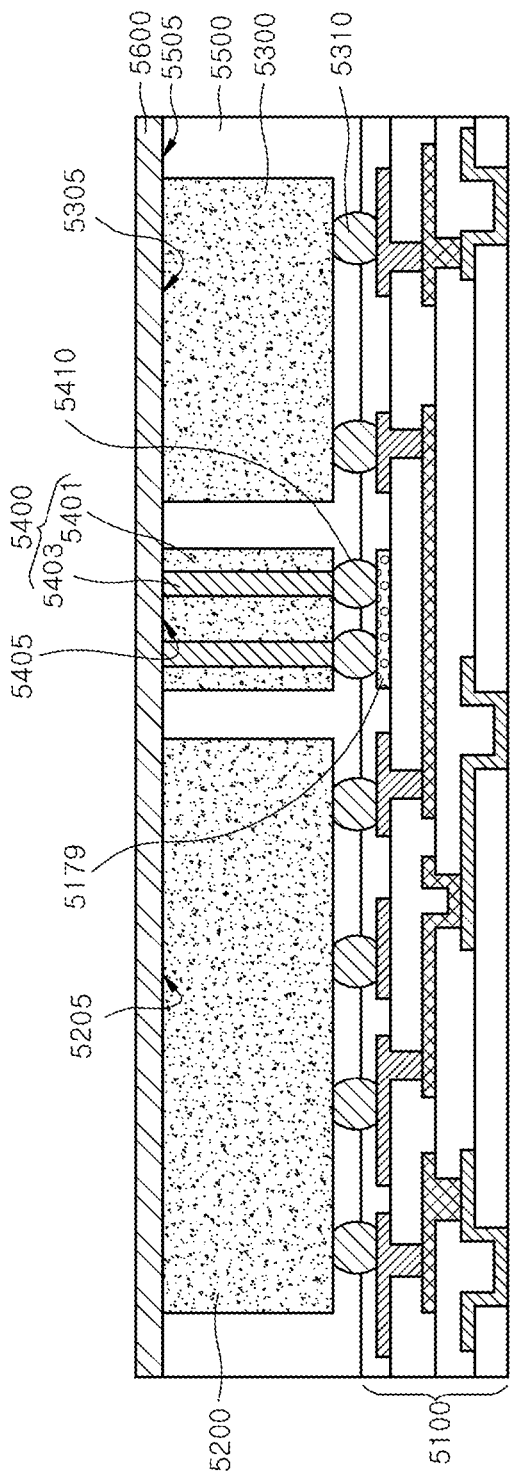

FIGS. 6, 7 and 8 are cross-sectional views illustrating a method of manufacturing a semiconductor package according to an embodiment. The method illustrated in FIGS. 6, 7 and 8 may correspond to a fabrication method of the semiconductor package 10 described with reference to FIG. 2. Some of processes illustrated in FIGS. 6, 7 and 8 may also be applicable to methods of manufacturing the semiconductor packages 20, 30 and 40 which are illustrated in FIGS. 3, 4 and 5.

FIG. 6 illustrates a step of forming an encapsulant layer 5501. For example, a carrier 5800 may be provided to act as a handler or a supporter used in formation of an interconnection layer 5100 with wafer processing techniques. The carrier 5800 may have a shape of a wafer. In an embodiment, the carrier 5800 may be a dummy silicon wafer. Alternatively, the carrier 5800 may be a wafer which is formed of a material other than a silicon material. For example, the carrier 5800 may be a sapphire wafer, a silicon-on-insulator (SOI) wafer, an insulation material wafer or a dielectric material wafer.

If a dummy silicon wafer is used as the carrier 5800, apparatuses and process techniques for fabricating semiconductor devices on semiconductor wafers may be used in formation of the interconnection layer 5100. Accordingly, the interconnection layer 5100 may be formed to include first to third redistributed patterns 5150, 5160 and 5170 having substantially the same critical dimension (CD) as circuit patterns of highly integrated semiconductor devices. The interconnection layer 5100 may be formed to have a thickness which is less than a thickness of PCBs. A buffer layer 5810 may be formed on the carrier 5800 prior to formation of the interconnection layer 5100 to act as a release layer for detaching the carrier 5800 from interconnection layer 5100 in a subsequent process. The interconnection layer 5100 and the carrier 5800 may be combined with each other by the buffer layer 5810 while the semiconductor package (10 of FIG. 2) is manufactured. In an embodiment, for example, a first surface 5101 of the interconnection layer 5100 may be attached to the buffer layer 5810.

Although the present embodiment illustrates an example in which the interconnection layer 5100 is formed by techniques for processing semiconductor wafers, a sequence of process steps or shapes of patterns used in the present embodiment may be modified to form various redistributed patterns in the interconnection layer 5100.

A first dielectric layer 5110 may be formed on a surface of the buffer layer 5810 opposite to the carrier 5800. The first dielectric layer 5110 may be formed by depositing or coating a dielectric material or by laminating a dielectric material. The first dielectric layer 5110 may be patterned to selectively etch or remove portions of the first dielectric layer 5110 and to expose portions of the buffer layer 5810. A metal material may be deposited or plated on the first dielectric layer 5110 and the exposed portions of the buffer layer 5810 to form the first redistributed patterns 5150.

A second dielectric layer 5120 may be formed on the first dielectric layer 5110 to cover the first redistributed patterns 5150. The second dielectric layer 5120 may be patterned to selectively etch or remove portions of the second dielectric layer 5120 and to expose portions of the first redistributed patterns 5150. A metal material may be deposited or plated on the second dielectric layer 5120 and the exposed portions of the first redistributed patterns 5150 to form the second redistributed patterns 5160. A third dielectric layer 5130 may be formed on the second dielectric layer 5120 to cover the second redistributed patterns 5160. The third dielectric layer 5130 may be patterned to selectively etch or remove portions of the third dielectric layer 5130 and to expose portions of the second redistributed patterns 5160. A metal material may be deposited or plated on the third dielectric layer 5130 and the exposed portions of the second redistributed patterns 5160 to form the third redistributed patterns 5170 and a heat sink pattern 5179. A fourth dielectric layer 5140 may be formed on the third dielectric layer 5130 to cover the third redistributed patterns 5170 and the heat sink pattern 5179. The fourth dielectric layer 5140 may be patterned to selectively etch or remove portions of the fourth dielectric layer 5140 and to expose portions of the third redistributed patterns 5170 and portions of the heat sink pattern 5179.

Although FIG. 6 illustrates an example in which the interconnection layer 5100 is formed to include the first to third redistributed patterns 5150, 5160 and 5170 located at three different levels, the present disclosure is not limited thereto. For example, the interconnection layer 5100 may be formed to include redistributed patterns which are located at a single level, at two different levels or at least four different levels.

A first semiconductor chip 5200 may be bonded to a second surface 5102 of the interconnection layer 5100 using first inner connectors 5210. The first semiconductor chip 5200 may correspond to a flip chip, a front side surface of which faces the interconnection layer 5100. A second semiconductor chip 5300 may also be bonded to the second surface 5102 of the interconnection layer 5100 using second inner connectors 5310. The second semiconductor chip 5300 may also correspond to a flip chip, a front side surface of which faces the interconnection layer 5100. As a result, the first and second semiconductor chips 5200 and 5300 may be disposed side-by-side on the second surface 5102 of the interconnection layer 5100 to be laterally spaced part from each other. In addition, a heat transferring block 5400 may also be bonded to the second surface 5102 of the interconnection layer 5100 using third inner connectors 5410. The heat transferring block 5400 may be disposed between the first and second semiconductor chips 5200 and 5300 and may also correspond to a flip chip, a front side surface of which faces the interconnection layer 5100. The heat transferring block 5400 may be provided to include a block body 5401 and a plurality of through vias 5403 vertically penetrating the block body 5401. The third inner connectors 5410 may be formed to penetrate the fourth dielectric layer 5140 and to connect the through vias 5403 of the heat transferring block 5400 to the heat sink pattern 5179. In some other embodiments, a heat transferring block (corresponding to the heat transferring block 2400 of FIG. 3) instead of the heat transferring block 5400 may be combined with the heat sink pattern 5179. In such a case, the heat transferring block 2400 may be thicker than the first and second semiconductor chips 5200 and 5300.

The encapsulant layer 5501 may be formed using a molding process to cover sidewalls of the first and second semiconductor chips 5200 and 5300 as well as to fill spaces between the heat transferring block 5400 and the first and second semiconductor chips 5200 and 5300. The encapsulant layer 5501 may also be formed to fill gaps between the second surface 5102 of the interconnection layer 5100 and the first and second semiconductor chips 5200 and 5300 as well as a gap between the second surface 5102 of the interconnection layer 5100 and the heat transferring block 5400. The interconnection layer 5100 may also have a first surface 5101 opposite to the first and second semiconductor chips 5200 and 5300. The encapsulant layer 5501 may be formed to cover a third surface 5205 of the first semiconductor chip 5200, a fifth surface 5305 of the second semiconductor chip 5300, and a seventh surface 5405 of the heat transferring block 5400. The third surface 5205, the fifth surface 5305 and the seventh surface 5405 may correspond to top surfaces (i.e., backside surfaces) of the first semiconductor chip 5200, the second semiconductor chip 5300 and the heat transferring block 5400, respectively. In an embodiment, for example, the encapsulant layer 5501 may be formed to cover a fourth surface 5206 of the first semiconductor chip 5200, a sixth surface 5306 of the second semiconductor chip 5300, and an eighth surface 5406 of the heat transferring block 5400. In an embodiment, for example, the fourth surface 5206, the sixth surface 5306, and eighth surface 5406 may correspond to bottom surfaces (i.e., front side surfaces) of the first semiconductor chip 5200, the second semiconductor chip 5300, and the heat transferring block 5400, respectively. In an embodiment, for example, the encapsulant layer 5501 may extend to fill gaps between the second surface 5102 of the interconnection layer 5100 and the semiconductor chips 5200 and 5300 as well as between the second surface 5102 of the interconnection layer 5100 and the heat transferring block 5400.

FIG. 7 illustrates a step of planarizing the encapsulant layer 5501. For example, a planarization process may be applied to a top surface 5502 of the encapsulant layer 5501 to form an encapsulant 5500 having a ninth surface 5505 that exposes the third surface 5205 of the first semiconductor chip 5200, the fifth surface 5305 of the second semiconductor chip 5300, and the seventh surface 5405 of the heat transferring block 5400. The planarization process may include a step of grinding the encapsulant layer 5501. In some embodiments, the planarization process may include an etch-back process or a chemical mechanical polishing (CMP) process. The third surface 5205 of the first semiconductor chip 5200, the fifth surface 5305 of the second semiconductor chip 5300, and the seventh surface 5405 of the heat transferring block 5400 may be located at substantially the same level as the ninth surface 5505 of the encapsulant 5500 by the planarization process. As a result of the planarization process, a globally planarized surface may be provided.

FIG. 8 illustrates a step of forming a heat dissipation layer 5600. For example, the heat dissipation layer 5600 may be formed to directly contact the third surface 5205 of the first semiconductor chip 5200, the fifth surface 5305 of the second semiconductor chip 5300, the seventh surface 5405 of the heat transferring block 5400, and the ninth surface 5505 of the encapsulant 5500. The heat dissipation layer 5600 may be formed by depositing or plating a metal material. The heat dissipation layer 5600 may be formed to include a metal material having a relatively high thermal conductivity. For example, the heat dissipation layer 5600 may be formed of an aluminum material or a copper material.

After the heat dissipation layer 5600 is formed, the carrier (5800 of FIG. 7) may be detached from the interconnection layer 5100. The buffer layer (5810 of FIG. 7) may act as a release layer and may be removed with the carrier 5800. For example, as illustrated in FIG. 2, outer connectors 700 may be attached to the interconnection layer 5100. The outer connectors 700 may include solder balls and may be attached to interconnection layer 5100 using a solder ball mounting process. After the outer connectors 700 are attached to the interconnection layer 5100, a singulation process may be performed to separate a plurality of packages from each other.

Figure 9:
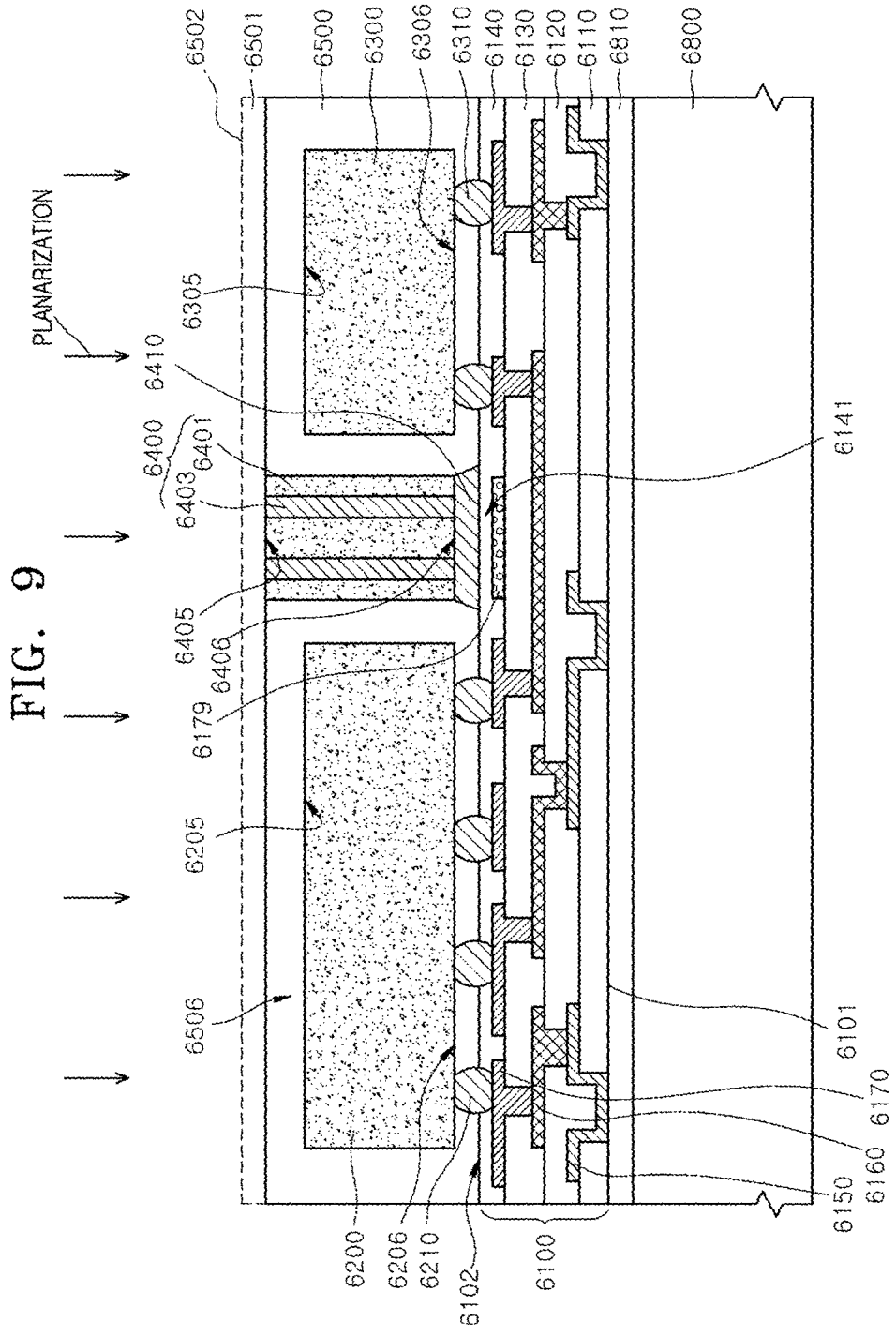
FIG. 9 is a cross-sectional view illustrating a method of manufacturing a semiconductor package according to an embodiment.

FIG. 9 is a cross-sectional view illustrating a method of manufacturing a semiconductor package according to other embodiments. The method illustrated in FIG. 9 may correspond to a fabrication method of the semiconductor package 20 described with reference to FIG. 3. Some of various processes illustrated in FIG. 9 may also be applicable to methods of manufacturing the semiconductor packages 10, 30 and 40 which are illustrated in FIGS. 2, 4 and 5.

FIG. 9 illustrates a step of planarizing an encapsulant layer 6501. For example, a buffer layer 6810 may be formed on a carrier 6800, and an interconnection layer 6100 including first to fourth dielectric layers 6110, 6120, 6130 and 6140 and first to third redistributed patterns 6150, 6160 and 6170 may be formed on a surface of the buffer layer 6810 opposite to the carrier 6800. A heat sink pattern 6179 may be additionally formed in the interconnection layer 6100 while the third redistributed patterns 6170 are formed.

A first semiconductor chip 6200 may be bonded to a second surface 6102 of the interconnection layer 6100 using first inner connectors 6210. The first semiconductor chip 6200 may correspond to a flip chip, a front side surface of which faces the interconnection layer 6100. A second semiconductor chip 6300 may also be bonded to the second surface 6102 of the interconnection layer 6100 using second inner connectors 6310. The second semiconductor chip 6300 may also correspond to a flip chip, a front side surface of which faces the interconnection layer 6100. As a result, the first and second semiconductor chips 6200 and 6300 may be disposed side-by-side on the second surface 6102 of the interconnection layer 6100 to be laterally spaced part from each other. In addition, a heat transferring block 6400 may also be bonded to the second surface 6102 of the interconnection layer 6100 using an adhesive layer 6410. The heat transferring block 6400 may be disposed between the first and second semiconductor chips 6200 and 6300 and may also correspond to a flip chip, a front side surface of which faces the interconnection layer 6100. The heat transferring block 6400 may be provided to include a block body 6401 and a plurality of through vias 6403 vertically penetrating the block body 6401. The heat transferring block 6400 may be thicker than the first and second semiconductor chips 6200 and 6300. An eighth surface 6406 of the heat transferring block 6400 may be bonded to a portion 6141 of the fourth dielectric layer 6140 by the adhesive layer 6410. The adhesive layer 6410 may be formed to overlap with the heat sink pattern 6179. The through vias 6403 vertically penetrating the block body 6401 may be directly bonded to the adhesive layer 6410. In some other embodiments, a heat transferring block (corresponding to the heat transferring block 3400 of FIG. 4) instead of the heat transferring block 6400 may be bonded to the fourth dielectric layer 6140. In such a case, top surfaces (i.e., backside surfaces) of the first and second semiconductor chips 6200 and 6300 and the heat transferring block 3400 may be located at the same level.

The encapsulant layer 6501 may be formed using a molding process to cover sidewalls of the first and second semiconductor chips 6200 and 6300 as well as to fill spaces between the heat transferring block 6400 and the first and second semiconductor chips 6200 and 6300. The encapsulant layer 6501 may also be formed to fill gaps between the second surface 6102 of the interconnection layer 6100 and the first and second semiconductor chips 6200 and 6300. For example, in an embodiment, the encapsulant layer 6501 may be formed to cover a fourth surface 6206 of the first semiconductor chip 6200, and a sixth surface 6306 of the second semiconductor chip 6300. In an embodiment, for example, the fourth surface 6206, the sixth surface 6306, and eighth surface 5406 may correspond to bottom surfaces (i.e., front side surfaces) of the first semiconductor chip 6200, the second semiconductor chip 6300, and the heat transferring block 6400, respectively. The interconnection layer 6100 may also have a first surface 6101 opposite to the first and second semiconductor chips 6200 and 6300. The encapsulant layer 6501 may be formed to cover a third surface 6205 of the first semiconductor chip 6200, a fifth surface 6305 of the second semiconductor chip 6300, and a seventh surface 6405 of the heat transferring block 6400. The third surface 6205, the fifth surface 6305 and the seventh surface 6405 may correspond to top surfaces (i.e., backside surfaces) of the first semiconductor chip 6200, the second semiconductor chip 6300 and the heat transferring block 6400, respectively.

A planarization process may be applied to a top surface 6502 of the encapsulant layer 6501 to form an encapsulant 6500 having a ninth surface 6505 that exposes the seventh surface 6405 of the heat transferring block 6400 and to leave a portion 6506 on the third surface 6205 of the first semiconductor chip 6200 and the fifth surface 6305 of the second semiconductor chip 6300. Although not illustrated in the drawings, a heat dissipation layer may be formed on the ninth surface 6505 of the encapsulant 6500 to directly contact the seventh surface 6405 of the heat transferring block 6400. After the heat dissipation layer is formed, the carrier 6800 may be detached from the interconnection layer 6100.

Figure 10:
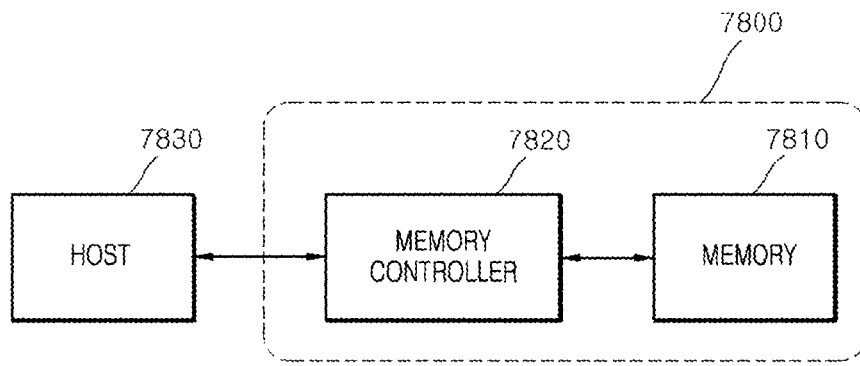
FIG. 10 is a block diagram illustrating an electronic system employing a memory card including at least one of packages according to some embodiments.

FIG. 10 is a block diagram illustrating an electronic system including a memory card 7800 including at least one of the semiconductor packages according to some embodiments. The memory card 7800 includes a memory 7810, such as, for example but not limited to, a nonvolatile memory device, and a memory controller 7820. The memory 7810 and the memory controller 7820 may store data or read stored data. The memory 7810 and/or the memory controller 7820 may include at least one of the semiconductor packages according to some embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 11:
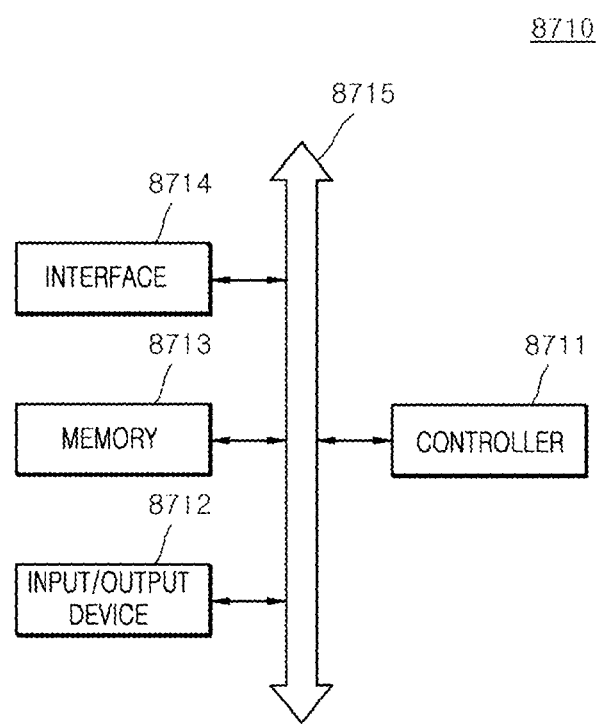
FIG. 11 is a block diagram illustrating an electronic system including at least one of the packages according to some embodiments.

FIG. 11 is a block diagram illustrating an electronic system 8710 including at least one of the semiconductor packages according to some embodiments. The electronic system 8710 may include a controller 8711, an input/output device 8712 and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system such as, for example but not limited to, CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
   a first semiconductor chip and a second semiconductor chip disposed on an interconnection layer and laterally spaced apart from each other;
   a heat transferring block disposed between the first and second semiconductor chips to be mounted on the interconnection layer;
   an encapsulant filling spaces between the heat transferring block and the first and second semiconductor chips and covering sidewalls of the first and second semiconductor chips; and
   a heat dissipation layer connected to a top surface of the heat transferring block opposite to the interconnection layer and extending to cover a top surface of the encapsulant,
   wherein the heat transferring block emits heat trapped in a region of the encapsulant between the first and second semiconductor chips,
   wherein the heat transferring block comprises a through via to emit the heat, and
   the through via is electrically isolated from the interconnection layer and the first and second semiconductor chips.

2. The semiconductor package of claim 1,
   wherein the heat transferring block is configured to reduce the thermal stress applied to the semiconductor package by including a block body having a material including a thermal conductivity which is higher than a thermal conductivity of a material of the encapsulant.

3. The semiconductor package of claim 1,
   wherein the heat transferring block includes a block body, and
   wherein the heat transferring block is configured to reduce the thermal stress applied to the semiconductor package by reducing a total amount of the encapsulant with a volume of a block body.

4. The semiconductor package of claim 1,
   wherein the heat transferring block includes a block body, and
   wherein the heat transferring block is configured to reduce the thermal stress applied to the semiconductor package by including the block body having a coefficient of thermal expansion substantially equal to a coefficient of thermal expansion of the first and second semiconductor chips.

5. The semiconductor package of claim 1,
   wherein the heat transferring block is configured to reduce the thermal stress applied to the semiconductor package by including a material configured to suppress defects generated in the semiconductor package by thermal stress which is due to a difference between thermal expansion coefficients of the block body and the first and second semiconductor chips.

6. The semiconductor package of claim 1,
   wherein the heat transferring block includes a block body, and
   wherein the heat transferring block is configured to reduce the thermal stress applied to the semiconductor package by including the block body having a semiconductor material.

7. The semiconductor package of claim 1, wherein the heat transferring block includes:
   a block body configured to have a top surface facing the heat dissipation layer and a bottom surface facing the interconnection layer; and
   a plurality of through vias penetrating the block body,
   wherein upper ends of the plurality of through vias are exposed at the top surface of the block body, and lower ends of the plurality of through vias are exposed at the bottom surface of the block body.

8. The semiconductor package of claim 7, wherein the block body has a shape of a silicon die.

9. The semiconductor package of claim 7, wherein the block body has a width which is greater than widths of the first and second semiconductor chips, in a direction that is substantially perpendicular to a direction along which the first and second semiconductor chips are arrayed.

10. The semiconductor package of claim 7, wherein the plurality of through vias are comprised of a material having a thermal conductivity which is higher than a thermal conductivity of the block body.

11. The semiconductor package of claim 7, wherein the plurality of through vias are comprised of a metal material.

12. The semiconductor package of claim 11, wherein the plurality of through vias are comprised of a copper material.

13. The semiconductor package of claim 1,
    wherein the interconnection layer includes first redistributed patterns, second redistributed patterns and third redistributed patterns;
    wherein a first group of the third redistributed patterns are coupled to the first semiconductor chip, and a second group of the third redistributed patterns are coupled to the second semiconductor chip;
    wherein at least one of the second redistributed patterns electrically connects one of the first group of the third redistributed patterns to one of the second group of the third redistributed patterns; and
    wherein an end of the at least one of the second redistributed patterns overlaps with an end of the first semiconductor chip, and the other end of the at least one of the second redistributed patterns overlaps with an end of the second semiconductor chip.

14. The semiconductor package of claim 13, wherein the first group of the third redistributed patterns are coupled to the first semiconductor chip through first inter connectors, and the second group of the third redistributed patterns are coupled to the second semiconductor chip through second inter connectors.

15. The semiconductor package of claim 1,
    wherein the first semiconductor chip includes an application processor chip; and
    wherein the second semiconductor chip includes a memory device receiving data from the first semiconductor chip or outputting data to the first semiconductor chip.

16. The semiconductor package of claim 1,
    wherein the interconnection layer is configured to include paths used in data communication between the first and second semiconductor chips.

17. A semiconductor package comprising:
    an interconnection layer and a heat sink pattern;
    a first semiconductor chip and a second semiconductor chip disposed on the interconnection layer and laterally spaced apart from each other;

a heat transferring block disposed between the first and second semiconductor chips to be mounted on the interconnection layer and to be coupled to the heat sink pattern;

an encapsulant filling spaces between the heat transferring block and the first and second semiconductor chips and covering sidewalls of the first and second semiconductor chips; and a heat dissipation layer connected to a top surface of the heat transferring block opposite to the interconnection layer and extending to cover a top surface of the encapsulant, wherein the heat transferring block comprises a through via to emit the heat, and the through via and the heat sink pattern are electrically isolated from the interconnection layer and the first and second semiconductor chips.

18. A semiconductor package comprising:

a first semiconductor chip and a second semiconductor chip disposed on an interconnection layer and spaced apart from each other;

a heat transferring block disposed between the first and second semiconductor chips and bonded to the interconnection layer by an adhesive layer;

an encapsulant filling spaces between the heat transferring block and the first and second semiconductor chips and covering sidewalls of the first and second semiconductor chips; and a heat dissipation layer connected to a top surface of the heat transferring block opposite to the interconnection layer and extending to cover a top surface of the encapsulant, wherein the adhesive layer bonds the interconnection layer to a bottom surface of the heat transferring block, wherein the heat transferring block emits heat trapped in a region of the encapsulant between the first and second semiconductor chips, and wherein the heat transferring block comprises a through via to emit the heat, and the through via is electrically isolated from the interconnection layer and the first and second semiconductor chips.

19. The semiconductor package of claim 18, wherein the interconnection layer includes first redistributed patterns, second redistributed patterns and third redistributed patterns;

wherein a first group of the third redistributed patterns are coupled to the first semiconductor chip, and a second group of the third redistributed patterns are coupled to the second semiconductor chip;

wherein at least one of the second redistributed patterns electrically connects one of the first group of the third redistributed patterns to one of the second group of the third redistributed patterns; and wherein an end of the at least one of the second redistributed patterns overlaps with an end of the first semiconductor chip, and the other end of the at least one of the second redistributed patterns overlaps with an end of the second semiconductor chip.

20. The semiconductor package of claim 19, wherein the interconnection layer further includes a heat sink pattern which is embedded in the interconnection layer to overlap with the at least one of the second redistributed patterns.

* * * * *